United States Patent
Hou et al.

(10) Patent No.: US 11,270,921 B2
(45) Date of Patent: Mar. 8, 2022

(54) SEMICONDUCTOR PACKAGE INCLUDING DIES HAVING HIGH-MODULUS DIELECTRIC LAYER AND MANUFACTURING METHOD THEREOF

(71) Applicant: Taiwan Semiconductor Manufacturing Co., Ltd., Hsinchu (TW)

(72) Inventors: Hao-Cheng Hou, Hsinchu (TW); Chien-Hsun Lee, Hsin-chu County (TW); Chung-Shi Liu, Hsinchu (TW); Jung-Wei Cheng, Hsinchu (TW); Tsung-Ding Wang, Tainan (TW); Yi-Yang Lei, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 16/869,596

(22) Filed: May 8, 2020

(65) Prior Publication Data

US 2021/0242100 A1    Aug. 5, 2021

Related U.S. Application Data

(60) Provisional application No. 62/967,594, filed on Jan. 30, 2020.

(51) Int. Cl.
*H01L 23/29*  (2006.01)
*H01L 21/56*  (2006.01)
(Continued)

(52) U.S. Cl.
CPC ............ *H01L 23/295* (2013.01); *H01L 21/56* (2013.01); *H01L 21/76804* (2013.01);
(Continued)

(58) Field of Classification Search
CPC . H01L 21/56; H01L 21/76804; H01L 23/295; H01L 23/291; H01L 23/3121;
(Continued)

(56) References Cited

U.S. PATENT DOCUMENTS 9,000,584 B2    4/2015  Lin et al.
9,048,222 B2    6/2015  Hung et al.
(Continued)

*Primary Examiner* — Herve-Louis Y Assouman
(74) *Attorney, Agent, or Firm* — JCIPRNET

(57) ABSTRACT

A semiconductor package includes semiconductor dies, an encapsulant, a high-modulus dielectric layer and a redistribution structure. The encapsulant encapsulates the semiconductor dies and is made of a first material. The high-modulus dielectric layer extends on the encapsulant and the semiconductor dies. The high-modulus dielectric layer is made of a second material. The redistribution structure extends on the high-modulus dielectric layer. The redistribution structure includes conductive patterns embedded in at least a pair of dielectric layers. The dielectric layers of the pair are made of a third material. The elastic modulus of the first material is higher than the elastic modulus of the third material. The elastic modulus of the second material is higher than the elastic modulus of the third material.

20 Claims, 15 Drawing Sheets

(51) Int. Cl.
  *H01L 21/768*   (2006.01)
  *H01L 23/31*    (2006.01)
  *H01L 23/48*    (2006.01)
  *H01L 25/065*   (2006.01)

(52) U.S. Cl.
  CPC ........ *H01L 23/291* (2013.01); *H01L 23/3121* (2013.01); *H01L 23/481* (2013.01)

(58) Field of Classification Search
  CPC ............... H01L 23/481; H01L 23/3135; H01L 23/3192
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,935,046 B1* | 4/2018 | Hung .................. H01L 23/3114 |
| 2005/0269719 A1* | 12/2005 | Hack .................... H01L 23/295 257/788 |
| 2017/0250138 A1* | 8/2017 | Hsieh .................... H01L 21/486 |
| 2017/0365566 A1* | 12/2017 | Lee .................... H01L 23/3114 |
| 2019/0088600 A1* | 3/2019 | Kuo .................... H01L 21/6835 |

\* cited by examiner

SEMICONDUCTOR PACKAGE INCLUDING DIES HAVING HIGH-MODULUS DIELECTRIC LAYER AND MANUFACTURING METHOD THEREOF

CROSS-REFERENCE TO RELATED APPLICATION

This application claims the priority benefit of U.S. provisional application Ser. No. 62/967,594, filed on Jan. 30, 2020. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
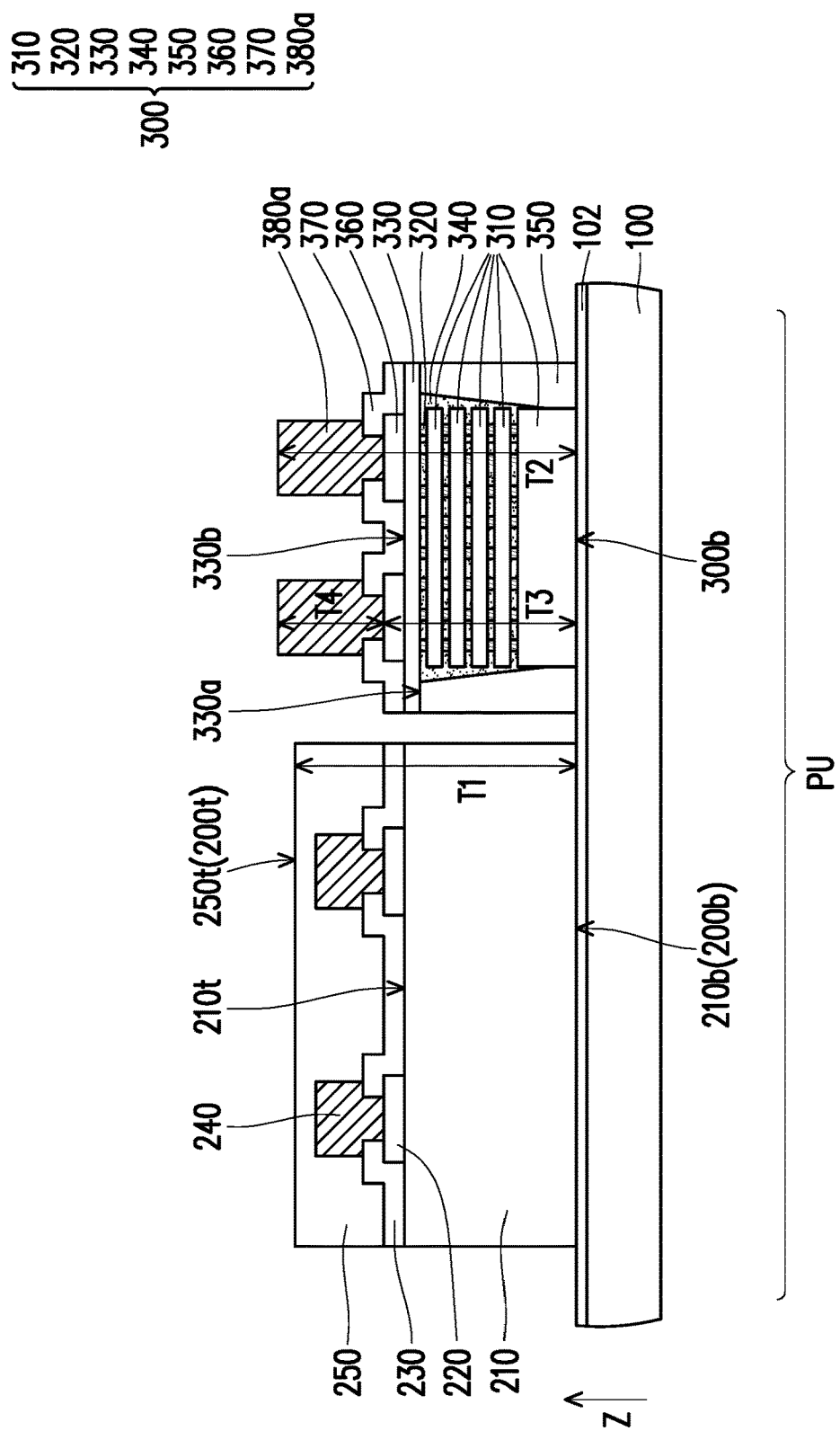
FIG. 1A to FIG. 1M are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1M are schematic cross-sectional views illustrating structures produced during a manufacturing process of a semiconductor package 10 in accordance with some embodiments of the disclosure. Referring to FIG. 1A, a carrier 100 is provided. In some embodiments, the carrier 100 is a glass substrate, a metal plate, a plastic supporting board or the like, but other suitable substrate materials may be used as long as the materials are able to withstand the subsequent steps of the process. In some embodiments, a de-bonding layer 102 is formed over the carrier 100. In some embodiments, the de-bonding layer 102 includes a light-to-heat conversion (LTHC) release layer, which facilitates peeling the carrier 100 away from the semiconductor package when required by the manufacturing process.

In some embodiments, referring to FIG. 1A, semiconductor dies 200, 300 are provided on the carrier 100. In some embodiments, the semiconductor dies 200, 300 are placed onto the carrier 100 through a pick-and-place method. Even though only two semiconductor dies 200, 300 are presented in FIG. 1A for illustrative purposes, it is understood that a semiconductor package according to some embodiments of the disclosure may contain more than two semiconductor dies 200, 300. Furthermore, a plurality of semiconductor dies 200, 300 may be provided on the carrier 100 to produce multiple package units PU with wafer-level packaging technology. Each of the semiconductor dies 200, 300 included in a package unit PU may independently be a bare die 200 or a packaged die 300, where the packaged die 300 may include one or more dies 310, 330 enclosed in an encapsulant 350 and/or having an encapsulant 350 formed thereon. For example, the packaged die 300 may be a die stack, as illustrated in FIG. 1A.

In some embodiments, a bare die 200 includes a semiconductor substrate 210, a plurality of contact pads 220, and a passivation layer 230. The contact pads 220 may be formed on a top surface 210t of the semiconductor substrate 210. The passivation layer 230 may cover the top surface 210t and have a plurality of openings that exposes at least a portion of each contact pad 220. A backside surface 210b of the semiconductor substrate 210 opposite to the top surface 210t may be referred to as the backside surface 200b of the bare die 200. In some embodiments, a bare die 200 further includes a plurality of contact posts 240 filling the openings of the passivation layer 230, thus establishing electrical connection to the contact pads 220. A protective layer 250 may surround the contact posts 240. In some embodiments, the contact posts 240 are initially covered by the protective layer 250, so that the top surface 250t of the protective layer 250 corresponds to the top surface 200t of the bare die 200. In some alternative embodiments, the contact posts 240 may be already exposed by the protective layer 250.

In some embodiments, the semiconductor substrate 210 may be made of semiconductor materials, such as semiconductor materials of the groups III-V of the periodic table. In some embodiments, the semiconductor substrate 210 includes elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 210 includes active components (e.g., transistors or the like) and optionally passive components (e.g., resistors, capacitors, inductors, or the like) formed therein.

In certain embodiments, the contact pads 220 include aluminum pads, copper pads, or other suitable metal pads. In some embodiments, the passivation layer 230 may be single-layered or multi-layered structures, including a silicon oxide layer, a silicon nitride layer, a silicon oxy-nitride layer, a dielectric layer formed by other suitable dielectric materials or combinations thereof. In some embodiments, the material of the contact posts 240 includes copper, copper alloys, or other conductive materials, and may be formed by deposition, plating, or other suitable techniques. In some embodiments, a material of the protective layer 250 may include a polymeric material, such as polyimide, acrylic resin, phenol resin, benzocyclobutene (BCB), polybenzoxazole (PBO), a combination thereof, or other suitable polymer-based dielectric materials. In some embodiments, the protective layer 250 may include one or more types of polyimides.

In some embodiment, a die stack may be included as the packaged die 300. In some embodiments, the packaged die 300 includes multiple stacked dies 310 electrically interconnected by micro-bumps 320. The dies 310 may have different thicknesses in the stacking direction (e.g., the vertical Z direction illustrated in FIG. 1A) with respect to each other, and may be stacked over a base die 330 having a larger footprint than the dies 310 in a plane perpendicular to the Z direction. The micro-bumps 320 electrically connect the dies 310 with each other and with the base die 330. An insulating material 340 may be optionally disposed in between the dies 310 surrounding the micro-bumps 320. The dies 310 may be encapsulated by an encapsulant 350. The encapsulant 350 may be located over the base die 330, on the side 330a of the base die 330 where the dies 310 are stacked. In some embodiments, the insulating material 340 may be omitted, and the encapsulant 350 may be disposed in between the dies 310 to surround the micro-bumps 320. Contact pads 360 are formed on the side 330b of the base die 330 opposite to the side 330a. Through semiconductor vias (not shown) may be formed in the base die 330 to electrically connect the contact pads 360 with the stacked dies 310. A passivation layer 370 may cover the side 330b of the base die 330, and at least partially cover the contact pads 360. The passivation layer 370 may include openings exposing portions of the contact pads 360. Contact posts 380 may be formed on the passivation layer 370, extending through the openings of the passivation layer 370 to establish electrical connection to the contact pads 360.

In some embodiments, the sizes of the bare dies 200 differ from the sizes of the packaged dies 300. For example, the thickness T1 of the bare die 200 illustrated in FIG. 1A may be smaller than the thickness T2 of the packaged die 300. The thickness T1 may be considered as the distance along the Z direction between the backside surface 200b and the top surface 200t of the bare die 200. At the manufacturing stage illustrated in FIG. 1A, the top surface 200t may be considered as the top surface 250t of the protective layer 250 (which, in some embodiments, covers the contact posts 240). The thickness T2 may be considered as the sum of the thickness T3 (the combined thickness of the interconnected stacked dies 310 with the intervening micro-bumps 320, the base die 330, and the contact pads 360) and the thickness T4 of the contact posts 380a. That is, in some embodiments, the contact posts 380a of the packaged die 300 may reach a level height along the Z direction higher than the level height of the top surface 200t of the bare die 200. In the disclosure, the individual thicknesses T1-T4 are not particularly limited.

Each one of the semiconductor dies 200, 300 may independently be or include a logic die, such as a central processing unit (CPU) die, a graphic processing unit (GPU) die, a micro control unit (MCU) die, an input-output (I/O) die, a baseband (BB) die, a field-programmable gate array (FPGA), an application processor (AP) die, or the like. In some embodiments, the semiconductor dies 200, 300 may also be or include memory dies, such as a high bandwidth memory die. For example, the memory die may be a dynamic random access memory (DRAM), a resistive random access memory (RRAM), a static random access memory (SRAM), or the like. In some embodiments, the semiconductor dies 200, 300 are the same type of dies or perform the same functions. In some embodiments, the semiconductor dies 200, 300 are different types of dies or perform different functions. The disclosure is not limited by the type of dies used for the semiconductor dies 200, 300 within a package unit PU. In some embodiments, a bare die 200 may be a system on chip type of die, including multiple devices formed in different regions of the semiconductor substrate 210. In some embodiments, a packaged die 300 may be a memory cube, for example, a high bandwidth memory die.

In some embodiments, the semiconductor dies 200, 300 are placed on the carrier 100 with the contact posts 240, 380a facing away from the carrier 100. Backside surfaces 200b, 300b of the semiconductor dies 200, 300 face the carrier 100. Portions of die attach film (not shown) may be disposed on the backside surfaces 200b, 300b, to secure the semiconductor dies 200, 300 to the carrier 100. In some embodiments, the die attach film includes a pressure adhesive, a thermally curable adhesive, or the like.

Figure 1B:
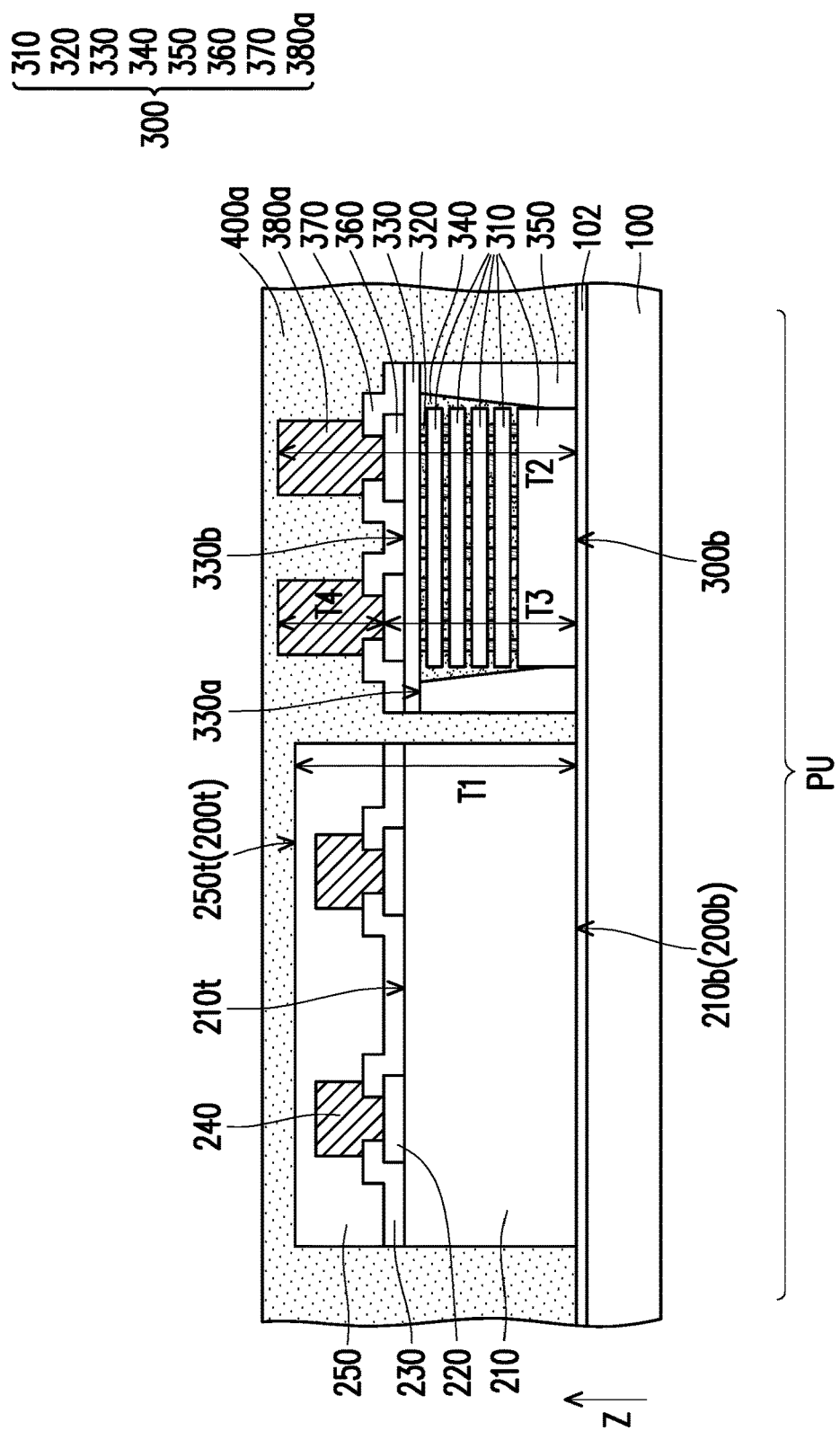
Figure 1C:
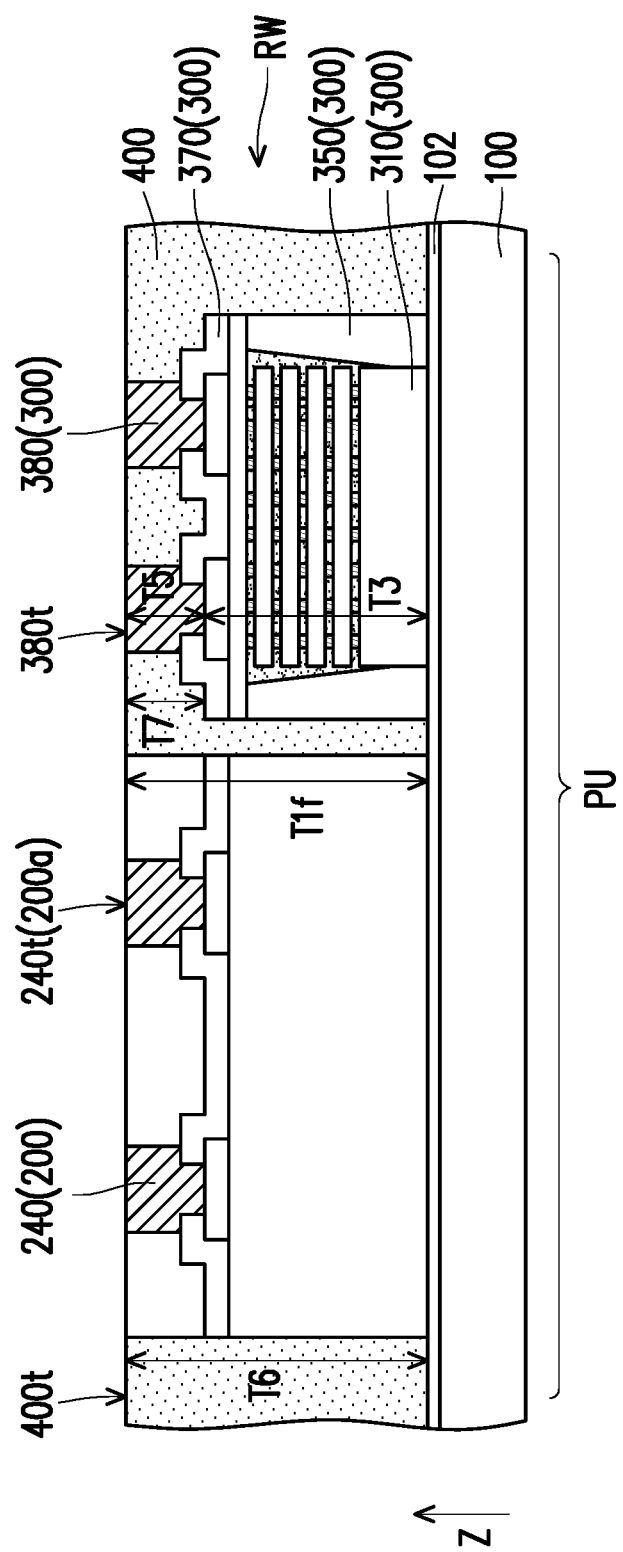

Referring to FIG. 1B, an encapsulating material 400a is formed over the carrier 100 to encapsulate the semiconductor dies 200, 300. In some embodiments, a material of the encapsulating material 400a includes a molding compound, a polymeric material, such as epoxy resin, acrylic resin, phenol resin, benzocyclobutene (BCB), polybenzoxazole (PBO), a combination thereof, or other suitable polymer-based dielectric materials. In some embodiments, the encapsulating material 400a further includes fillers, for example, inorganic fillers such as silica beads, metal oxides, ceramic particles or the like. In some embodiments, the encapsulant may include an epoxy resin in which the fillers are dispersed. The fillers may be used to tune the mechanical properties of the encapsulating material 400a, such as the elastic properties. In some embodiments, the Young's modulus of the encapsulating material 400a is in the range from 5 GPa to 30 GPa.

The encapsulating material 400a may be originally formed by a molding process (such as a compression molding process) or a spin-coating process so as to completely cover the semiconductor dies 200, 300. In some embodiments, referring to FIG. 1B and FIG. 1C, portions of the encapsulating material 400a are removed during a planarization process to form the encapsulant 400. The planarization process may include performing a mechanical grinding process and/or a chemical mechanical polishing (CMP) process. In some embodiments, the planarization process is performed until the contact posts 240, 380 of the semiconductor dies 200, 300 are exposed. In some embodiments, portions of the protective layer 250 and the contact posts 240, 380a may also be removed during the thinning or planarization process of the encapsulating material 400a. For example, the initial thickness T4 of the contact posts 380a may be reduced, resulting in contact posts 380 of thickness T5, where T5 is smaller than T4. Similarly, the initial thickness T1 of the bare die 200 may be reduced to a final thickness T1f. Following the planarization process, the top surfaces 240t of the contact posts 240 are exposed at the active surfaces 200a of the bare dies 200. The active surfaces 200a of the bare dies 200, the top surfaces 380t of the contact posts 380 of the packaged dies 300, and the top surface 400t of the encapsulant 400 may be substantially at a same level height along the Z direction (be substantially coplanar). In some embodiments, the direction Z is normal to the top surface 400t of the encapsulant 400. The thickness T6 of the encapsulant 400 on the carrier 100 or the de-bonding film 102 may be substantially equal to the final thickness T1f of the bare die 200. As illustrated in FIG. 1B, the portions of encapsulant 400 of thickness T6 laterally encapsulate the semiconductor dies 200, 300. In some embodiments, the encapsulant 400 also partially extends on top of the semiconductor dies 200, 300. For example, portions of encapsulant 400 may extend over the passivation layer 370 of the packaged die 300, thus wrapping the contact posts 380. The portions of encapsulant 400 extending on the semiconductor die 300 have a thickness T7 along the Z direction smaller than the thickness T6. That is, in some embodiments, the encapsulant 400 may partially cover the front surfaces of at least some of the packaged dies 300.

With the formation of the encapsulant 400, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1C, a single package unit PU is shown for simplicity but, of course, this is for illustrative purposes only, and the disclosure is not limited by the number of package units PU being produced in the reconstructed wafer RW.

Figure 1D:
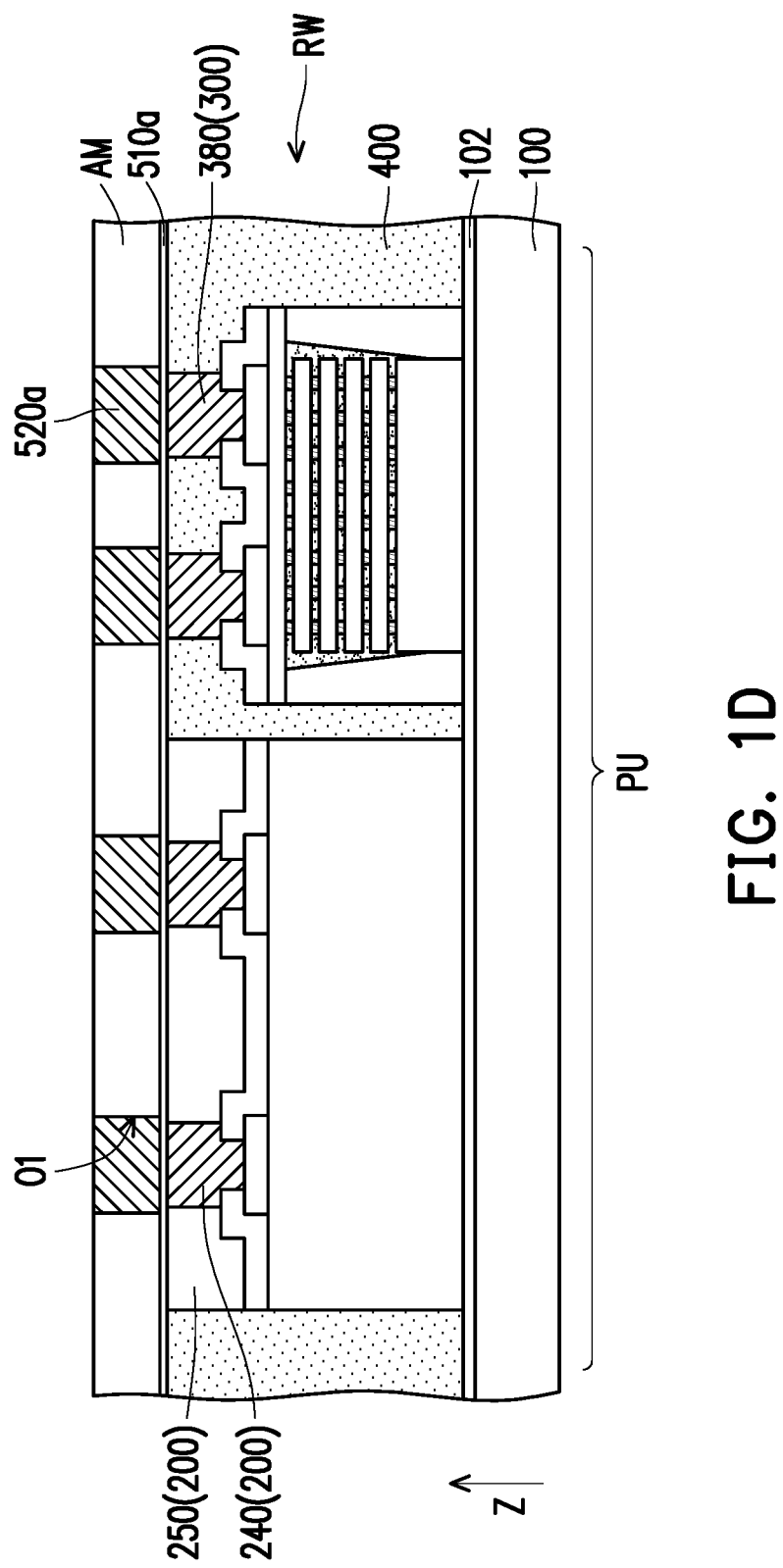

In some embodiments, referring to FIG. 1D, a seed material layer 510a is provided over the semiconductor dies 200, 300, and the encapsulant 400. In some embodiments, the seed material layer 510a is blanketly formed over the package unit PU. In some embodiments, the seed material layer 510a establishes electrical contact to the contact posts 240 and 380 of the semiconductor dies 200 and 300, respectively. The seed material layer 510a may be formed through, for example, a sputtering process, a physical vapor deposition (PVD) process, or the like. In some embodiments, the seed material layer 510a may include, for example, copper, tantalum, titanium, a combination thereof, or other suitable materials. In some embodiments, a barrier layer (not shown) may be deposited before forming the seed material layer 510a to prevent out-diffusion of the material of the seed material layer 510a.

An auxiliary mask AM may be provided over the seed material layer 510a. In some embodiments, the auxiliary mask AM is patterned so as to cover only part of the seed material layer 510a. The auxiliary mask AM includes openings O1 through which portions of the seed material layer 510a are exposed. In some embodiments, the portions of seed material layer 510a exposed by the auxiliary mask AM lie over the contact posts 240, 380 of the semiconductor dies 200, 300. In some embodiments, the portions of seed material layer 510a exposed by the auxiliary mask AM further extends over the protective layer 250 of the bare die 200 and/or the encapsulant 400. In some embodiments, the auxiliary mask AM is produced by a sequence of deposition, photolithography, and etching. A material of the auxiliary mask AM may include a positive photoresist or a negative photoresist. In some embodiments, a conductive material 520a is formed over the seed material layer 510a in the openings O1. In some embodiments, the conductive material 520a may include copper, nickel, tin, palladium, gold, titanium, aluminum, tungsten, or alloys thereof. In some embodiments, the conductive material 520a may be formed by a plating process. The plating process is, for example, electro-plating, electroless-plating, immersion plating, or the like.

Figure 1E:
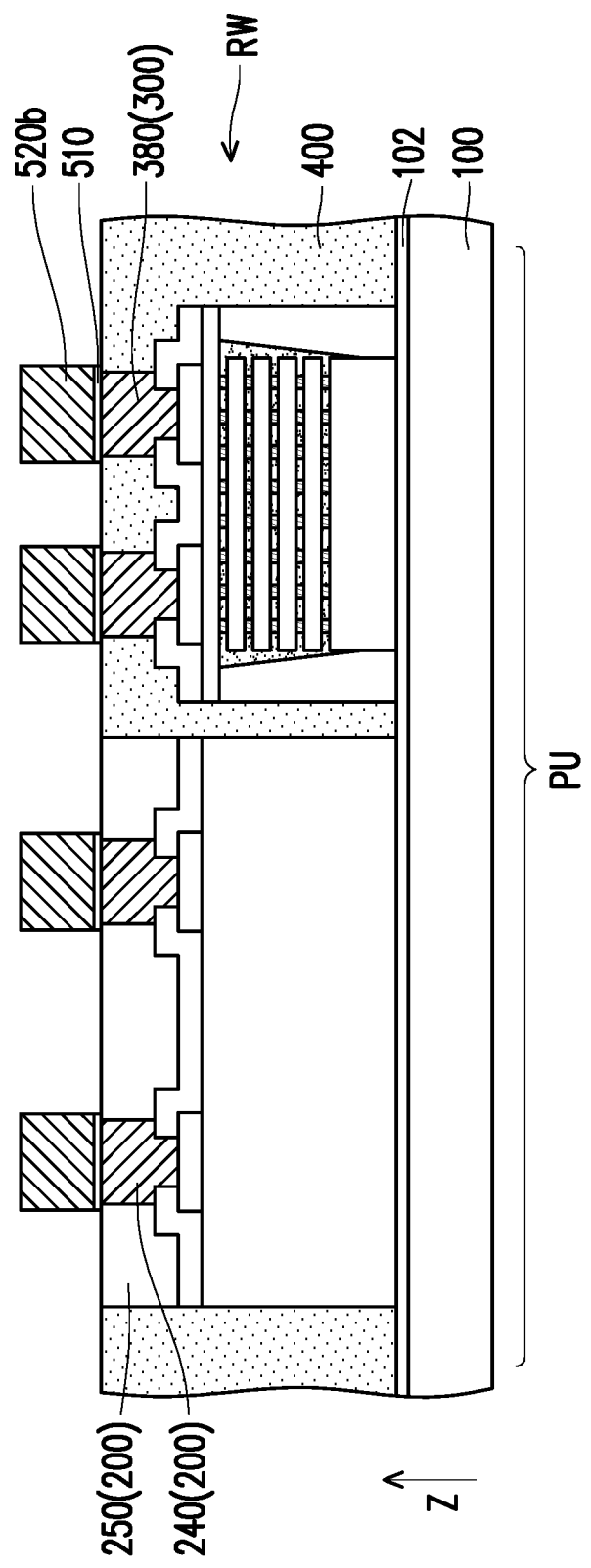

Referring to FIG. 1D and FIG. 1E, the auxiliary mask AM and the underlying portions of seed material layer 510a may be removed. In some embodiments, the auxiliary mask AM may be removed or stripped through, for example, etching, ashing, or other suitable removal processes. In some embodiments, the conductive material 520a formed in the openings O1 remains after removal of the auxiliary mask AM to form precursor through vias 520b. Upon removal of the auxiliary mask M1, the portions of seed material layer 510a that are not covered by the precursor through vias 520b are removed to render seed layers 510 disposed between the precursor through vias 520b and the contact posts 240, 380 of the semiconductor dies 200, 300. In some embodiments, the seed layers 510 further extend between the precursor through vias 520b and the protective layer 250 or the encapsulant 400. The exposed portions of the seed material layer 510a may be removed through an etching process. In some embodiments, the material of the precursor through vias 520b may be different from the material of the seed material layer 510a, so the portions of the seed material layer 510a exposed after removal of the auxiliary mask AM may be removed through selective etching. Upon removal of the auxiliary mask AM and the underlying portions of seed material layer 510a, portions of the encapsulant 400 and the protective layers 250 of the bare dies 200 may be exposed.

Figure 1F:
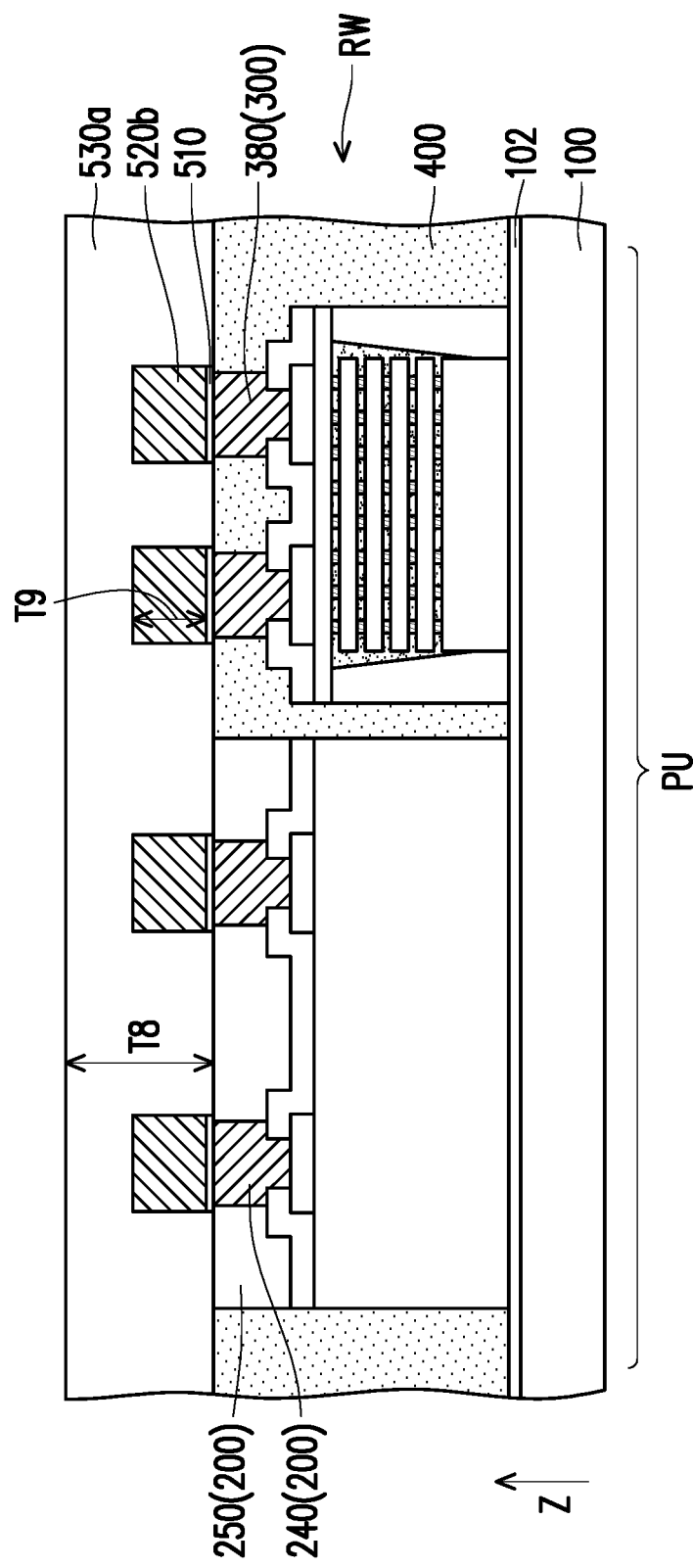

Referring to FIG. 1F, a high-modulus dielectric material layer 530a is provided on the package unit PU, extending on the encapsulant 400 and the protective layer 250 and embedding the precursor through vias 520b. In some embodiments, the thickness T8 of the high-modulus dielectric material layer 530a along the Z direction may be sufficient to completely cover the precursor through vias 520b. That is, the thickness T8 of the high-modulus dielectric material layer 530a may be greater than the thickness T9 of the precursor through vias 520b. A material of the high-modulus dielectric material layer 530a is not particularly limited, and may include molding compound, Ajinomoto build-up film, polymeric materials (e.g., polyimide, polyester, benzocyclobutene (BCB), polybenzoxazole, or the like), prepreg, resin coated copper (RCC), photo image dielectric (PID), phenolic paper, phenolic cotton paper, woven fiberglass cloth, impregnated woven fiberglass cloth, inorganic materials (e.g., ceramic materials), or a combination thereof. In some embodiments, the high-modulus dielectric material layer includes an organic resin and inorganic fillers, such as glass beads. In some embodiments, the high-modulus dielectric material layer 530a may include a ceramic material, such as oxides. That is, the high-modulus dielectric material layer 530a may be a layer of ceramic material. When the high-modulus dielectric material layer 530a is a layer of ceramic material, it may be fabricated by physical vapor deposition (PVD), chemical vapor deposition (CVD), sintering of sprayed or coated ceramic glue, or the like. In some embodiments, the high-modulus dielectric material layer 530a may be a layer of a composite material. For example, the composite material may include molding compound or Ajinomoto build-up film mixed with fillers such as silica or glass beads. In some alternative embodiments, the composite material may include a polymer, such as polyimide or polybenzooxazole with a filler dispersed therein. The filler may be silica, glass, SiC particles, or carbon nanotubes, for example. In some embodiments, the high-modulus dielectric material layer 530a is laminated over the package unit PU. In some alternative embodiments, the high-modulus dielectric material layer 530a is formed by molding (e.g., compression molding) or other suitable deposition techniques. In some embodiments, the precursor through vias 520b are subjected to a micro-roughening treatment before providing the high-modulus dielectric material layer 530a, to enhance adhesion and decrease the occurrence of delamination.

Figure 1G:
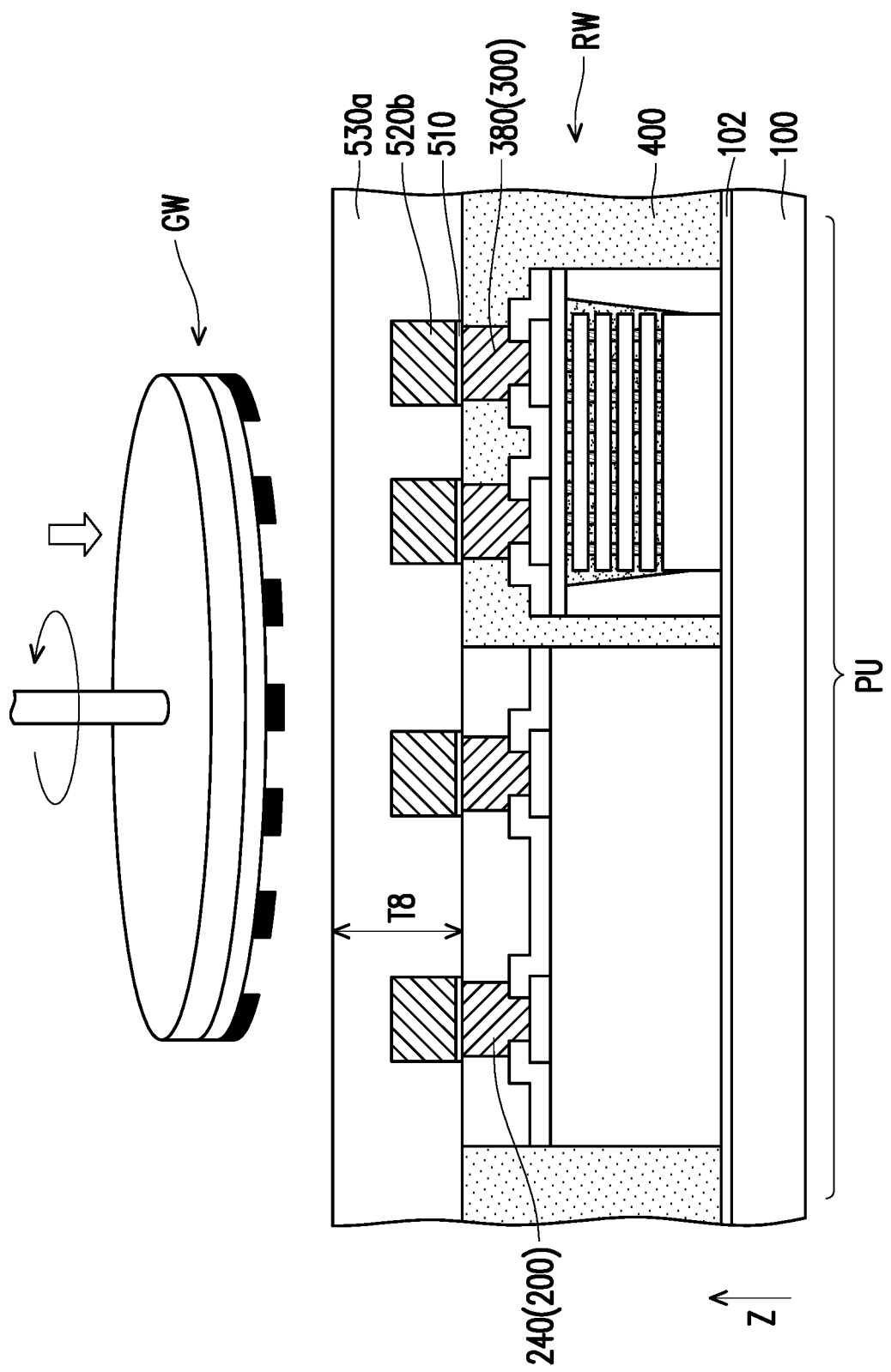
Figure 1H:
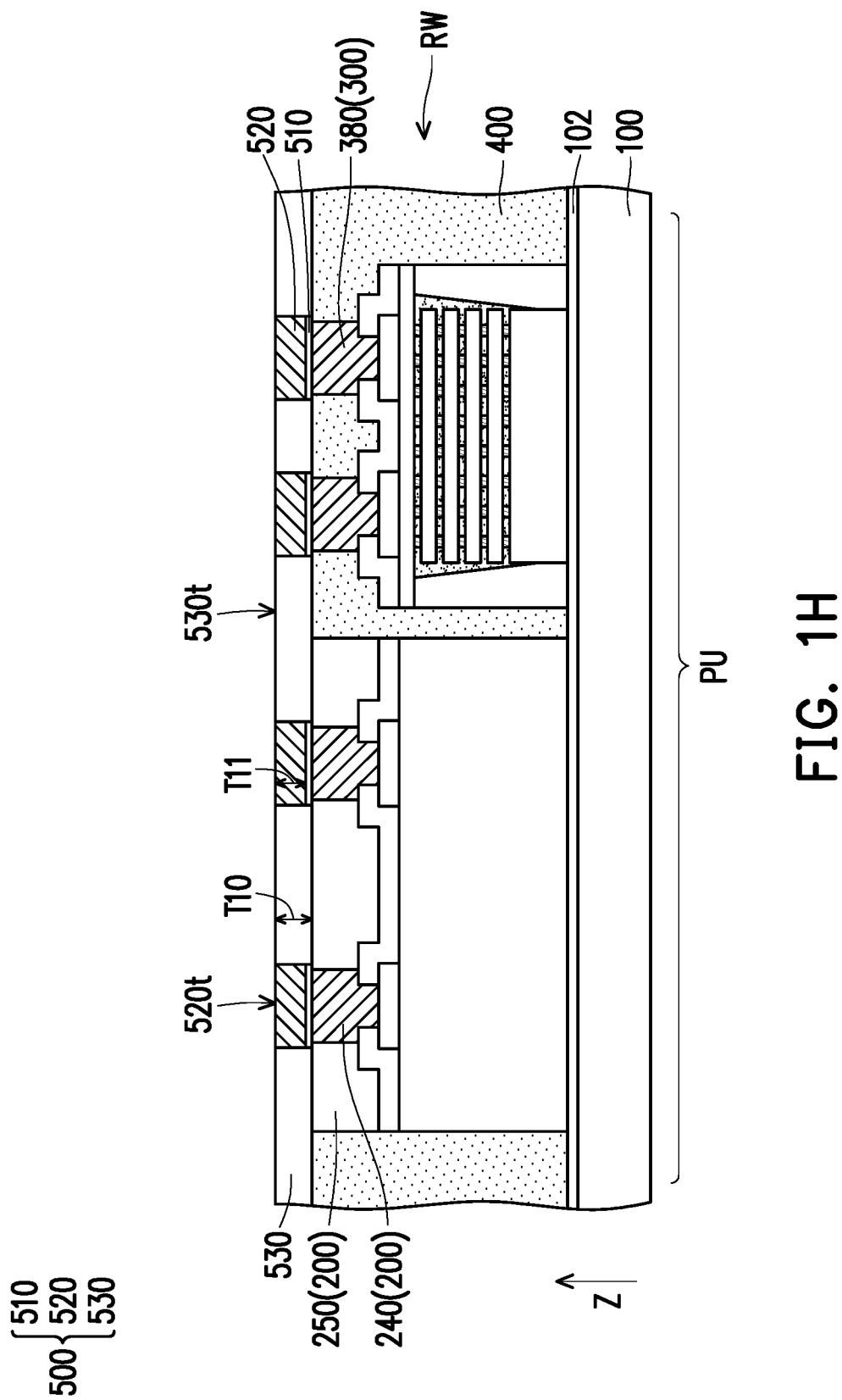

Referring to FIG. 1F to FIG. 1H, in some embodiments the high-modulus dielectric material layer 530a may be thinned to form the high-modulus dielectric layer 530. Portions of the high-modulus dielectric material layer 530a may be removed, for example during a grinding process, to reduce the thickness T8 of the high-modulus dielectric material layer 530a to the thickness T10 of the high-modulus dielectric layer 530. In some embodiments, the thickness T10 may be in the range from 10 micrometers to 200 micrometers, for example in the range from 10 micrometers to 50 micrometers. In some embodiments, the thickness T10 is in the range from 20 micrometers to 100 micrometers, for example, in the range from 20 micrometers to 50 micrometers. In some embodiments, the thickness T10 is at least 10 micrometers, for example, about 25 micrometers. In some embodiments, the high-modulus dielectric material layer 530a may be thinned during a grinding process employing a grinding wheel GW. During grinding, the precursor through vias 520b may also be thinned from the original thickness T9 to the final thickness T11 to form the through vias 520. The final thickness T11 may be substantially equal to the thickness T10. That is, after grinding, the top surface 530t of the high-modulus dielectric layer 530 may be located substantially at the same level height along the Z direction as the top surfaces 520t of the through vias 520. In some embodiments, depending on the grinding conditions, the top surfaces 520t of the through vias 520 may slightly protrude over the top surface 530t of the high-modulus dielectric layer 530. In some embodiments, the high-modulus dielectric layer 530 and the through vias 520 with or without the seed layers 510 may be collectively referred to as buffer layer 500. In some embodiments, the Young's modulus of the high-modulus dielectric layer 530 may be in the range between 5 GPa and 25 GPa. In some embodiments, the high-modulus dielectric layer 530 may have a Young's modulus comparable to the one of the encapsulant 400. For example, the ratio of the Young's modulus of the high-modulus dielectric layer 530 to the Young's modulus of the encapsulant 400 may be in the range from 0.5 to 3. In some embodiments, the Young's modulus of the high-modulus dielectric layer 530 is higher than the Young's modulus of the protective layer 250 of the bare die 200. For example, the protective layer 250 may have a Young's modulus in the range of 2 to 4 GPa, and the ratio of the Young's modulus the high-modulus dielectric layer 530 to the Young's modulus of the protective layer 250 may be at least 1.5. Similarly, the encapsulant 400 may have a Young's modulus higher than the Young's modulus of the protective layer 250. In some embodiments the Young's modulus of the materials used may be isotropic.

Figure 1I:
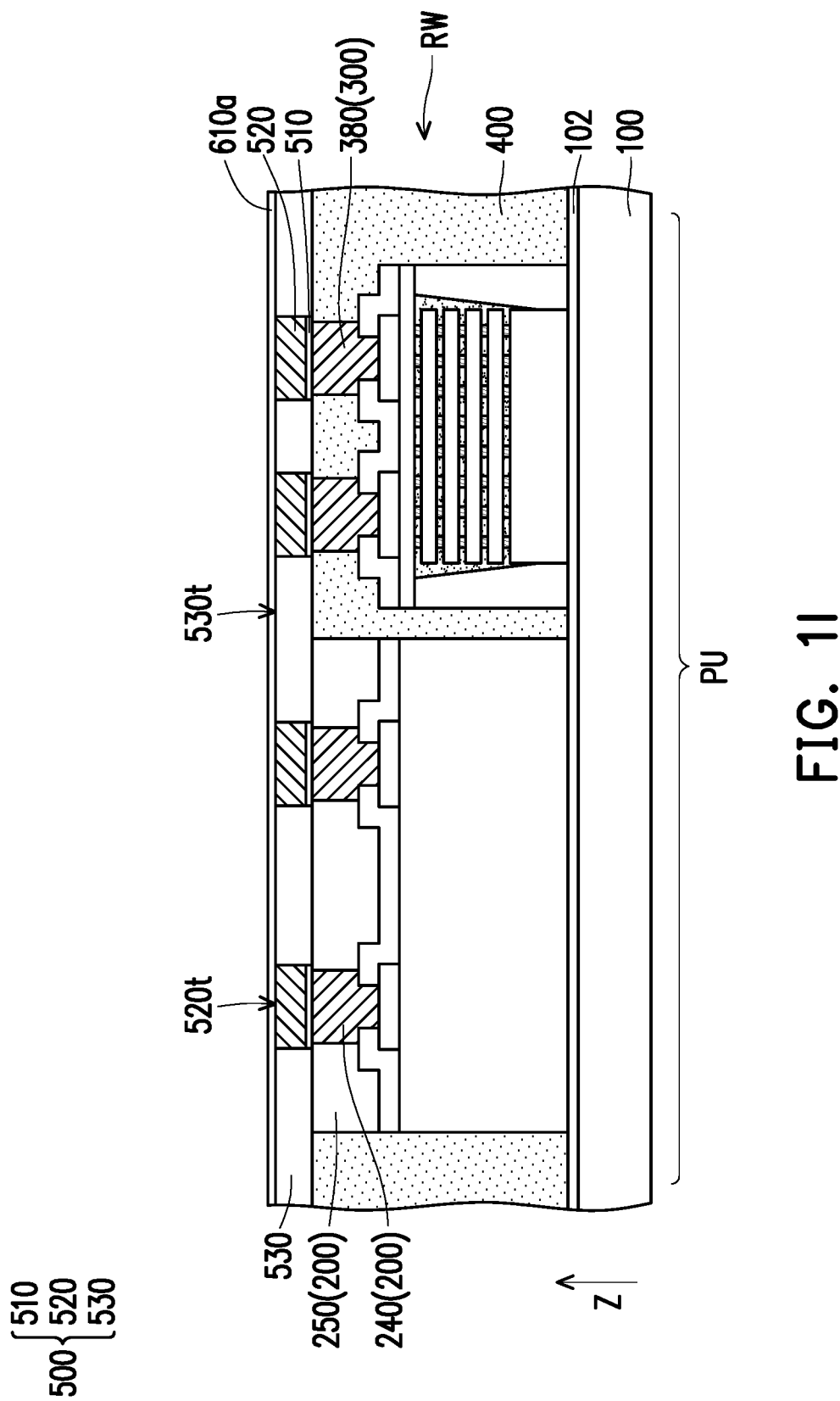
Figure 1J:
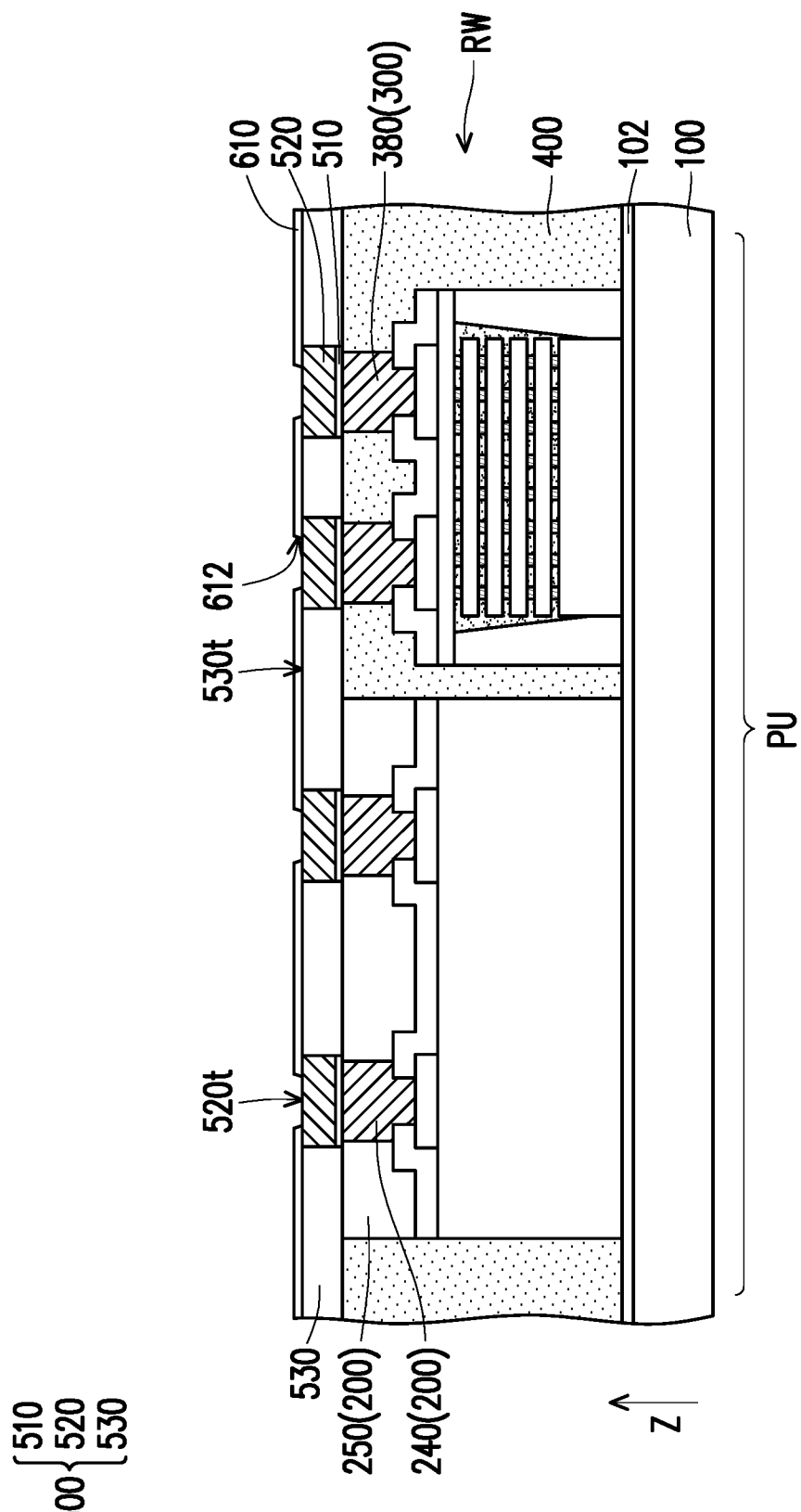
Figure 1K:
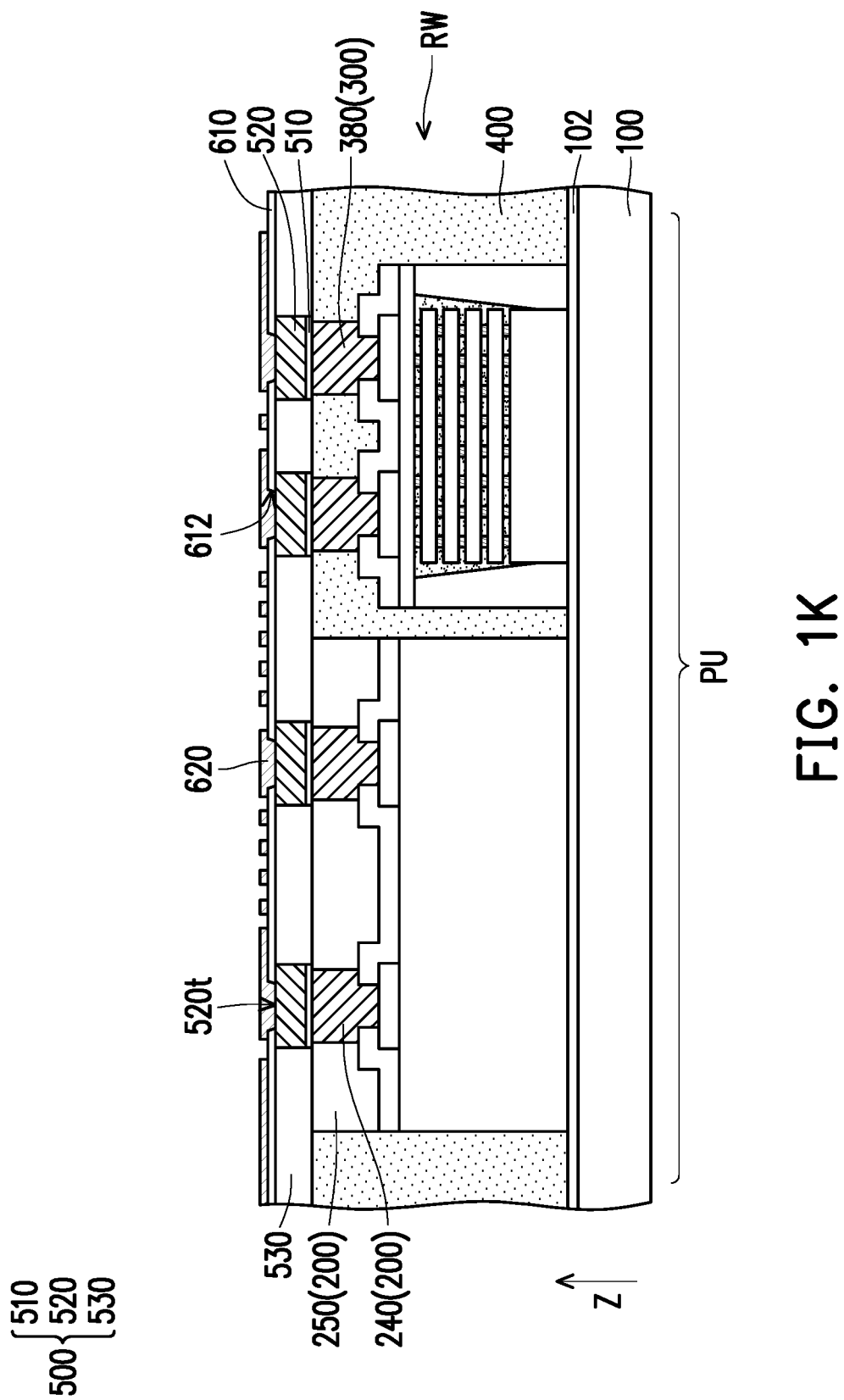

In some embodiments, referring to FIG. 1I, a dielectric material layer 610a is blanketly formed throughout the package unit PU on the buffer layer 500. The dielectric material layer 610a may initially cover the top surface 530t of the high-modulus dielectric layer 530 and the top surfaces 520t of the through vias 520. In some embodiments, the material of the dielectric material layer 610a includes polyimide, epoxy resin, acrylic resin, phenol resin, benzocyclobutene (BCB), polybenzooxazole (PBO), or any other suitable polymer-based dielectric material. In some embodiments, the dielectric material layer 610a include polyimide. In some embodiments, a Young's modulus of the dielectric material layer 610a is up to about 3 GPa, and is lower than the Young's modulus of the high-modulus dielectric layer 530. The dielectric material layer 610a, for example, may be formed by suitable fabrication techniques such as spin-on coating, chemical vapor deposition (CVD), plasma-enhanced chemical vapor deposition (PECVD), or the like. Referring to FIG. 1I and FIG. 1J, the dielectric material layer 610a may be patterned to form a dielectric layer 610 including openings 612 exposing portions of the top surfaces 520t of the through vias 520. In some embodiments, the dielectric material layer 610a may be patterned via an etching step employing auxiliary masks (not shown). As illustrated in FIG. 1K, a redistribution conductive layer 620 may be formed on the dielectric layer 610. Portions of the redistribution conductive layer 620 extend on the dielectric layer 610 to form routing traces, and portions of the redistribution conductive layer 620 may extend within the openings 612 to form redistribution vias contacting the through vias 520. The routing traces and the redistribution vias may be connected with each other, without a clear interface separating them. The redistribution conductive layer 620 may be formed by depositing a conductive material on the dielectric layer 610. The pattern of the redistribution conductive layer 620 may be obtained, for example, by depositing the conductive material in the openings of an auxiliary mask (not shown). The material of the redistribution conductive layer 620 may include aluminum, titanium, copper, nickel, tungsten, or alloys thereof. The redistribution conductive layer 620 may be formed by, for example, electroplating, deposition, and/or photolithography and etching.

Figure 1L:
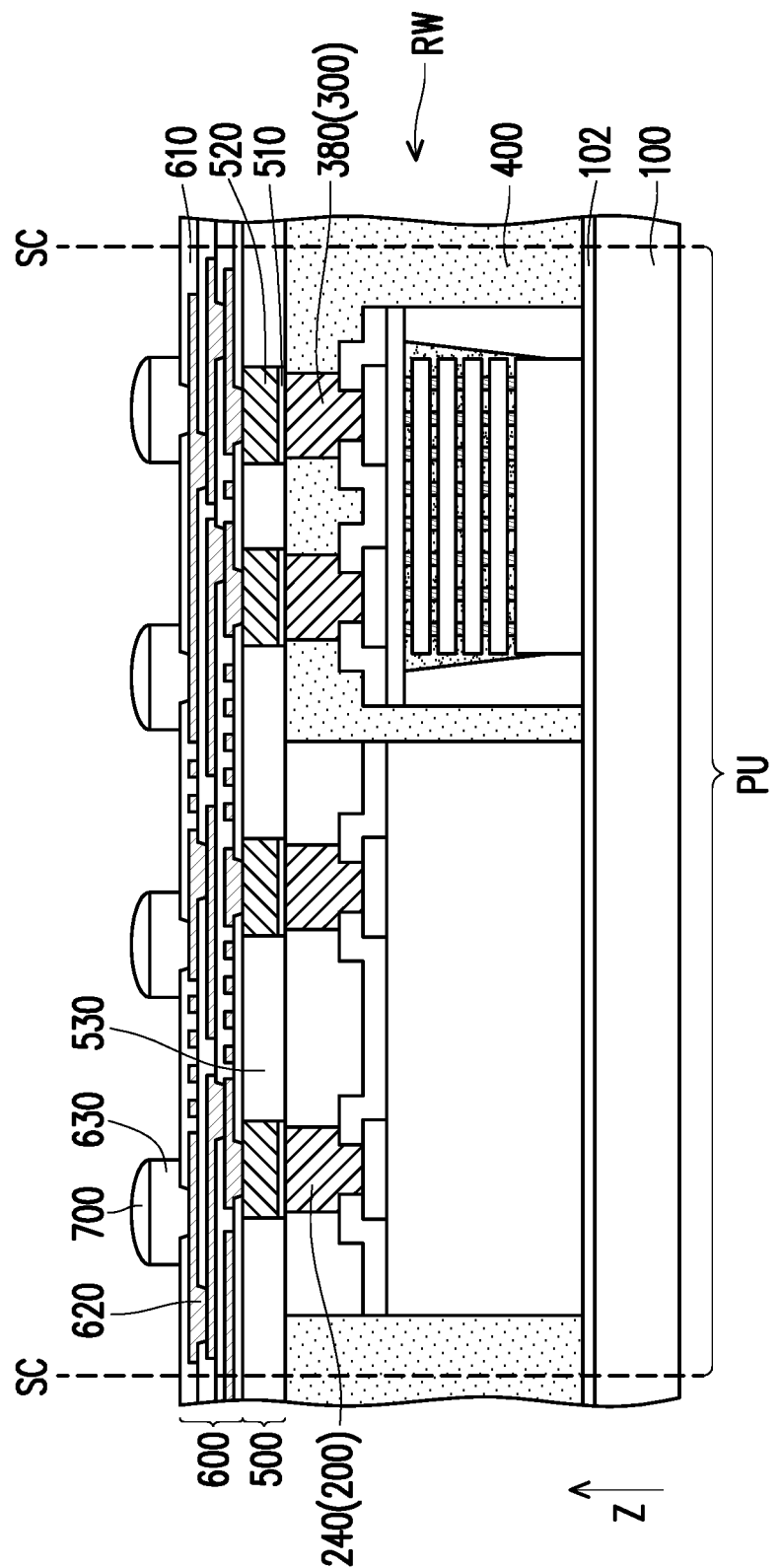

Referring to FIG. 1L, a redistribution structure 600 is formed by providing additional dielectric layers 610 and redistribution conductive layers 620 interspersed in the stacked dielectric layer 610 following steps similar to the ones described above. The redistribution conductive layers 620 may include a plurality of routing traces and redistribution vias. The routing traces are sandwiched between two adjacent dielectric layers 610, and the routing vias extend vertically through the dielectric layers 610 to establish electrical connection between routing traces of different metallization tiers, or between the routing traces and the through vias 520 of the buffer layer 500. That is, the buffer layer 500 may be interposed between the redistribution structure 600 and the semiconductor dies 200, 300. The through vias 520 may establish electrical connection between the semiconductor dies 200, 300 and the redistribution conductive layers 620 of the redistribution structure 600.

It should be noted that the disclosure is not limited by the number of redistribution conductive layers 620 and the number of the dielectric layers 610. In some alternative embodiments, fewer or more redistribution conductive layers 620 and fewer or more dielectric layers 610 than the ones illustrated in FIG. 1L may be formed depending on the circuit design. When more redistribution conductive layers 620 and more dielectric layers 610 are required, the redistribution conductive layers 620 are still stacked alternately with the dielectric layers 610.

In some embodiments, the outermost dielectric layer 610 (the dielectric layer further away from the semiconductor dies 200, 300) may include openings exposing portions of the outermost redistribution conductive layer 620. The redistribution structure 600 may further include under-bump metallurgies 630 conformally formed in the openings of the outermost dielectric layer 610. In some embodiments, the under-bump metallurgies 630 may further extend over portions of the outermost dielectric layer 610 surrounding the openings. In some embodiments, the under-bump metallurgies 630 may be multi-layered structures including different conductive materials. In some embodiments, a material of the under-bump metallurgies 630 includes copper, nickel, tin, palladium, gold, titanium, aluminum, or alloys thereof.

In some embodiments, connective terminals 700 are formed over the under-bump metallurgies 630. The connective terminals 700 may include solder balls, ball grid array (BGA) connectors, metal pillars, controlled collapse chip connection (C4) bumps, bumps formed via electroless nickel—electroless palladium—immersion gold technique (ENEPIG), a combination thereof (e.g., a metal pillar with a solder ball attached), or the like.

Figure 1M:
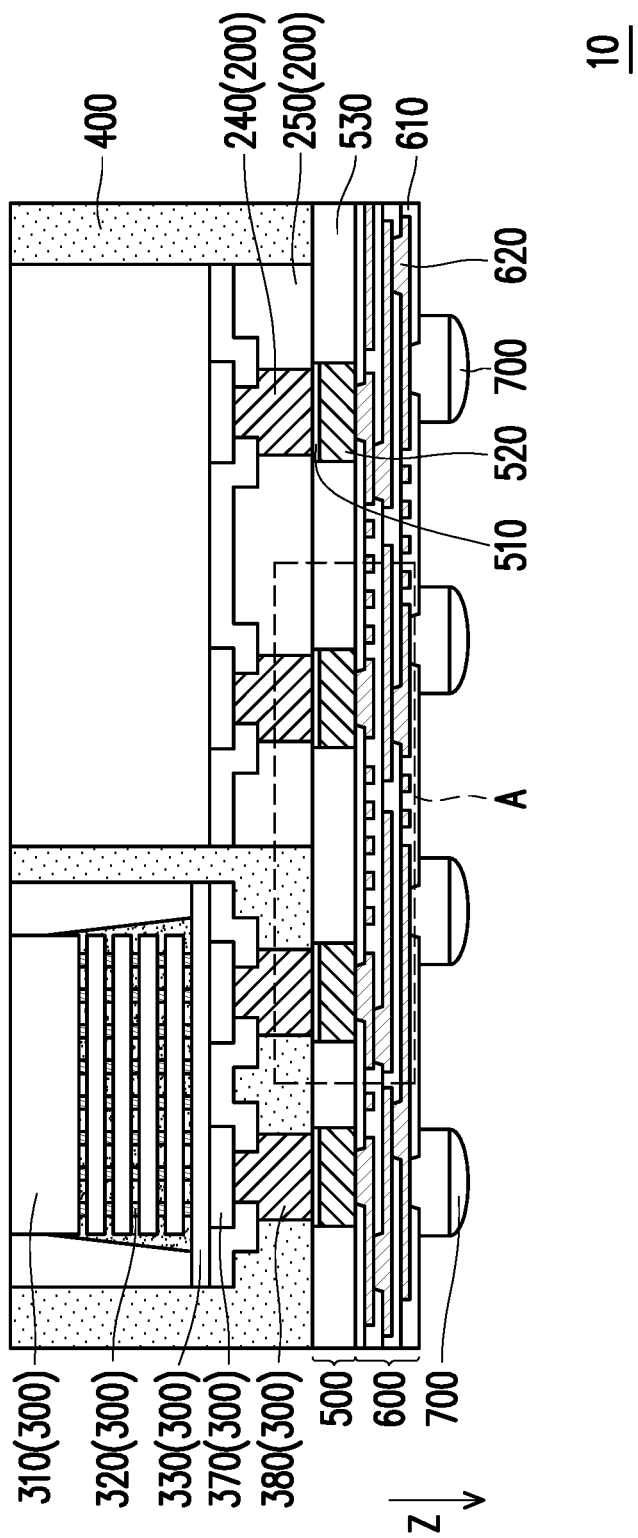

In some embodiments, referring to FIG. 1L and FIG. 1M, a singulation step is performed to separate the individual semiconductor packages 10, for example, by cutting through the reconstructed wafer RW along the scribe lanes SC arranged between individual package units PU. In some embodiments, adjacent semiconductor packages 10 may be separated by cutting through the scribe lanes SC of the reconstructed wafer RW. In some embodiments, the singulation process typically involves performing a wafer dicing process with a rotating blade and/or a laser beam. In some embodiments, the carrier 100 is separated from the semiconductor packages 10 following singulation. If the de-bonding layer 102 (e.g., the LTHC release layer) is included, the de-bonding layer 102 may be irradiated with a UV laser so that the carrier 100 and the de-bonding layer 102 are easily peeled off from the semiconductor packages 10. Nevertheless, the de-bonding process is not limited thereto, and other suitable de-bonding methods may be used in some alternative embodiments.

After the singulation step and removal of the carrier 100, a plurality of semiconductor packages 10 are obtained. A cross-sectional view of a semiconductor package 10 according to some embodiments of the disclosure is illustrated in FIG. 1L. The semiconductor package 10 includes the semiconductor dies 200, 300 laterally wrapped by the encapsulant 400. Portions of the encapsulant 400 may extend over the semiconductor dies 200, 300, for example in between the packaged die 300 and the buffer layer 500. The buffer layer 500 is disposed between the encapsulated semiconductor dies 200, 300 and the redistribution structure 600. The through vias 520 of the buffer layer 500 establish electrical connection between the contact posts 240, 380 of the semiconductor dies 200, 300 and the redistribution conductive layers 620 of the redistribution structure 600, and hence, electrically connect the semiconductor dies 200, 300 to the connective terminals 700.

Figure 2:
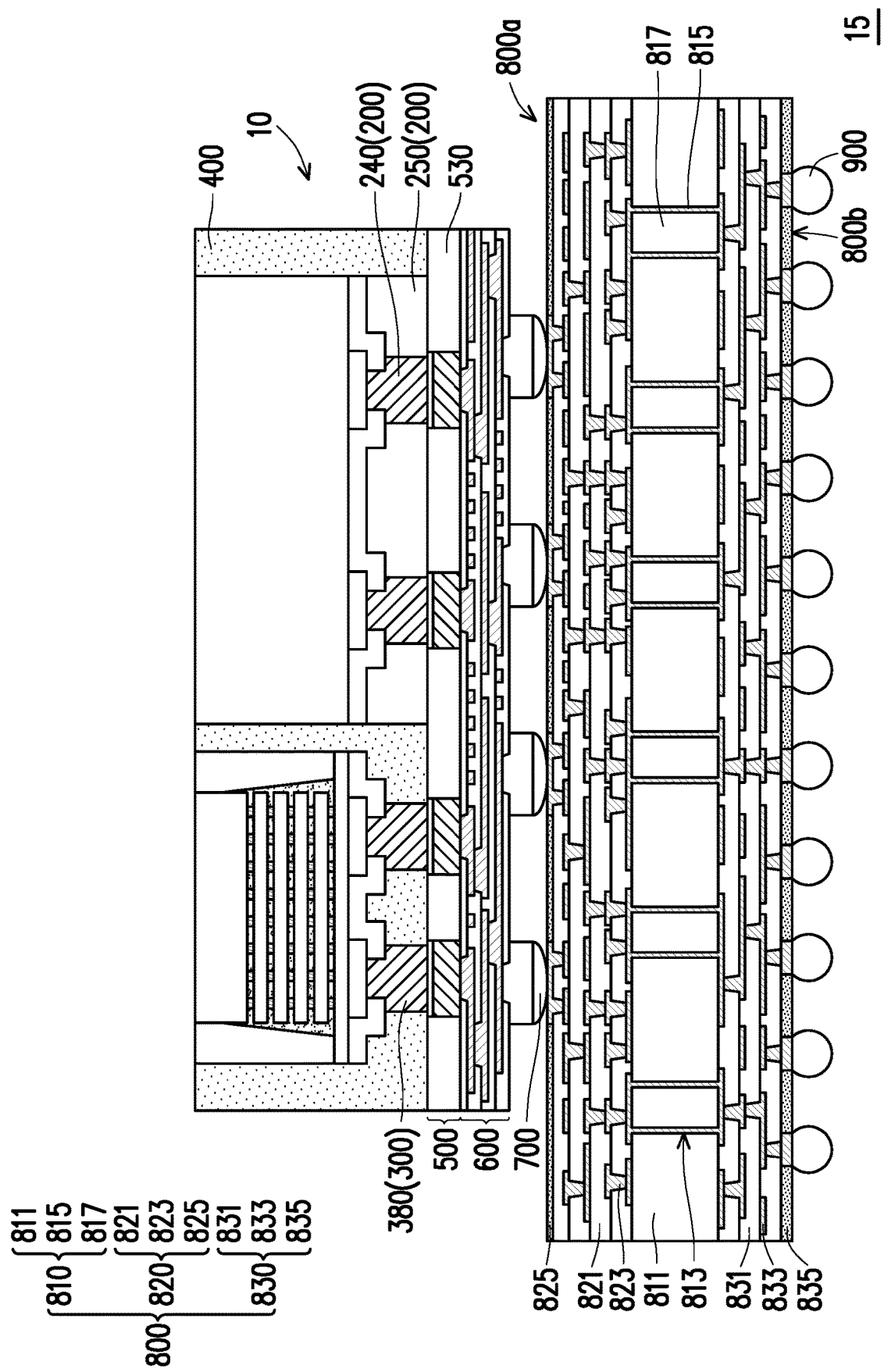
FIG. 2 is a schematic cross-sectional view illustrating a semiconductor package connected to a circuit substrate in accordance with some embodiments of the disclosure.

Referring to FIG. 2, in some embodiments, the semiconductor package 10 may be connected to a circuit substrate 800, such as a printed circuit board or the like, to be integrated within larger semiconductor devices 15. In some embodiments, the circuit substrate 800 includes a core layer 810 and build-up stacks 820, 830 disposed on opposite sides of the core layer 810. The core layer 810 may include a dielectric layer 811 including through holes 813 which cross the dielectric layer 811 from side to side. The through holes 813 may be lined with conductive material forming the through vias 815. In some embodiments, the through vias 815 only partially fill (e.g., line the edges of) the through holes 813, which are filled by a dielectric filling 817. In some alternative embodiments, the through holes 813 are filled by the through vias 815. In some embodiments, each build-up stack 820 or 830 respectively includes dielectric layers 821 or 831 and conductive patterns 823 or 833 embedded in the corresponding dielectric layer 821 or 831. The conductive patterns 823 or 833 and the through vias 815 may provide electrical connection between opposite sides of the circuit substrate 800. In some embodiments, the build-up stacks 820, 830 may independently include more or fewer dielectric layers 821, 831 and conductive patterns 823, 833 than what is illustrated in FIG. 2, according to the routing requirements. In some embodiments, the through vias 815 establish electrical connection between the conductive patterns 823 of one build-up stack 820 with the conductive patterns 833 of the other build-up stack 830. Patterned mask layers 825 and 835 may be optionally formed over the outermost dielectric layer 821 of the first build-up stack 820 and over the outermost dielectric layer 831 of the second build-up stack 830, respectively. The patterned mask layers 825, 835 may include openings exposing portions of the outermost conductive patterns 823, 833 of the respective build-up stacks 820 and 830. In some embodiments, a material of the patterned mask layers 825, 835 include polymeric materials, or other suitable insulating materials. In some embodiments, the material of the patterned mask layers 825, 835 includes silica, barium sulfate, epoxy resin, a combination thereof, or the like. The materials of the patterned mask layers 825, 835 serving as solder masks may be selected to withstand the temperatures of molten conductive materials (e.g., solders, metals, and/or metal alloys) used to connect the semiconductor package 10 or other devices (not shown) to the circuit substrate 800. In some embodiments, the patterned mask layer 825 includes different materials than the patterned mask layer 835. However, the disclosure is not limited by the structure of the circuit substrate 800, and circuit substrates with different structures with respect to the one illustrated in FIG. 2 may be used.

In some embodiments, the semiconductor package 10 is connected to the circuit substrate 800 from the side of the build-up stack 820 (e.g., the side 800a), while conductive terminals 900 are disposed at an opposite side 800b of the circuit substrate 800. In some embodiments, the connective terminals 700 of the semiconductor package 10 contact the conductive patterns 823 of the circuit substrate 800 to establish electrical connection. In some embodiments, an underfill (not shown) is optionally disposed between the semiconductor package 10 and the circuit substrate 800 to protect the connective terminals 700 from thermal and mechanical stresses. In some embodiments, the semiconductor package 10 may be soldered to the circuit substrate 800, during one or more heating steps. In some embodiments, the circuit substrate 800 and the semiconductor package 10, may have different coefficients of thermal expansion, which result in different thermal behaviors (e.g., amount of expansion) for the semiconductor package 10 and the circuit substrate 800 during the one or more heating steps. This difference in thermal behavior may produce mechanical stress at the level of the connective terminals 700 which may be transmitted through the redistribution structure 600 to the other components of the semiconductor package 10. In some embodiments, because the semiconductor package 10 includes the buffer layer 500 with the high-modulus dielectric layer 530 between the redistribution structure 600 and the other components of the semiconductor package 10, the mechanical stress may be effectively absorbed or dissipated by the buffer layer 500, protecting the integrity of the semiconductor package 10. That is, inclusion of the high-modulus dielectric layer 530 in between the semiconductor dies 200, 300 and the redistribution structure 600 may help to effectively disperse the mechanical stress transmitted by the redistribution structure 600, possibly reducing the occurrence of cracking or delamination between the encapsulant 400 and the semiconductor dies 200, 300 with respect to the case in which the high-modulus dielectric layer 530 is not included. By avoiding direct physical contact between the redistribution structure 600 and the semiconductor dies 200, 300 or the encapsulant 400, the buffer layer 500 may effectively absorb or dissipate stresses transmitted through the redistribution structure 600 towards the other components of the semiconductor package 10. Therefore, the yield of the manufacturing process may increase, thus reducing unitary production costs, and the reliability and lifetime of the semiconductor package 10 and the semiconductor device 15 may also increase.

Figure 3:
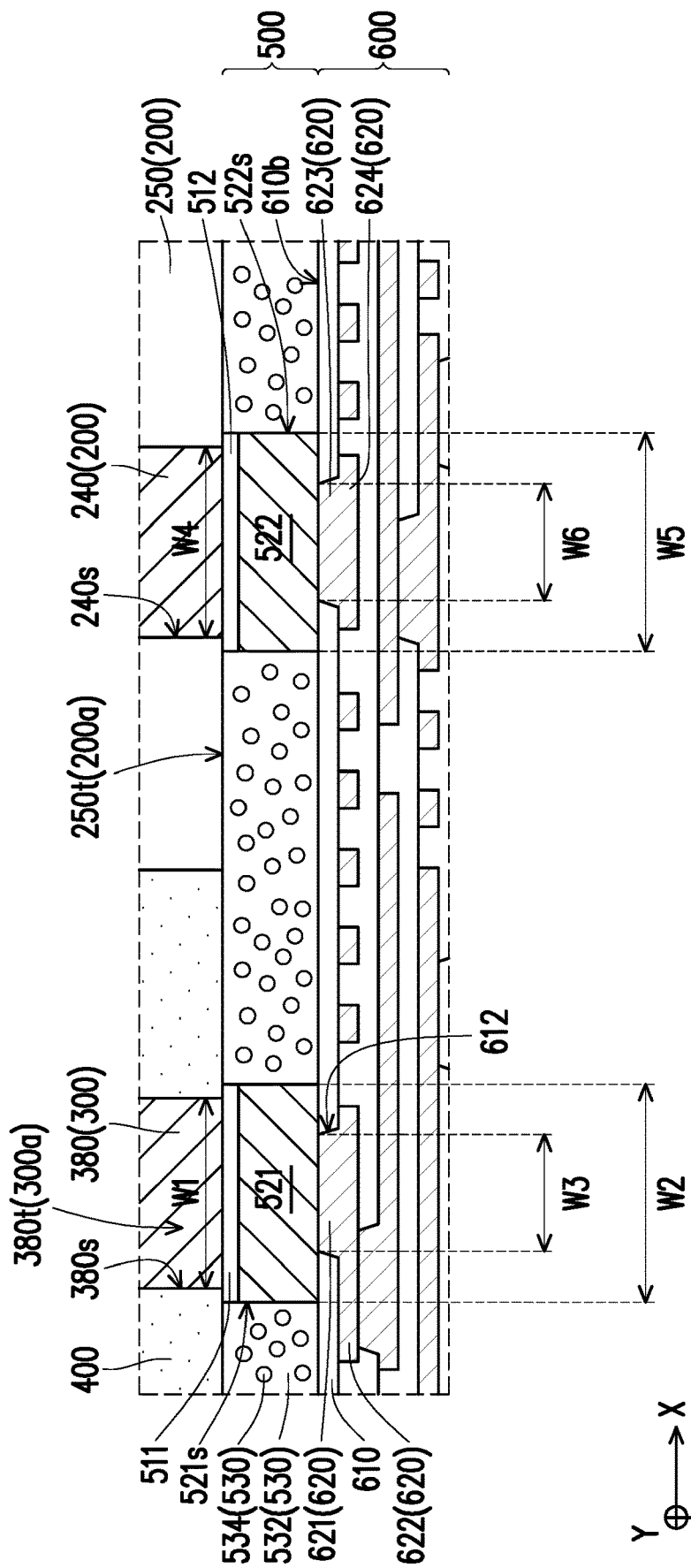
FIG. 3 is a schematic cross-sectional view of a portion of a semiconductor package in accordance with some embodiments of the disclosure.

FIG. 3 is a schematic cross-sectional view of the portion of the semiconductor package 10 enclosed by the area A illustrated in FIG. 1M according to some embodiments of the disclosure. In FIG. 3 are illustrated some aspects of the connection of the semiconductor dies 200, 300 to the redistribution structure 600 through the buffer layer 500 according to some embodiments of the disclosure. For example, the high-modulus dielectric layer 530 is illustrated as comprising a resin 532 and fillers 534. is illustrated the contact post 380 of the packaged die 300 illustrated in FIG. 3 is connected to the redistribution via 621 of the redistribution structure 600 by the through via 521. The redistribution via 621 is further connected to the routing trace 622, and the routing trace 622 is itself connected to other conductive patterns of the redistribution conductive layers 620. In some embodiments, a ratio of the width W1 of the contact post 380 to the width W2 of the through via 521 may be in the range from 0.5 to 4. The width W1 and W2 may be measured along a direction (e.g., the direction X) perpendicular to the vertical direction Z. Similar dimensional relationship may exist, however, along the direction Y, or along any other direction lying in the XZ plane. The XZ plane is considered to be parallel to the active surfaces 200a, 300a of the semiconductor dies 200, 300. In some embodiments, side surfaces 380s of the contact post 380 may be substantially aligned along the Z direction (be coplanar with) side surfaces 521s of the through via 521. However, the disclosure is not limited thereto. In some alternative embodiments, the shapes (footprints) of the contact post 380 and the through via 521 in the XY plane may differ and/or be offset with respect to each other. In some embodiments, the width W2 is greater than the width W3 of the redistribution via 621 to which the through via 521 is connected, where W2 and W3 are measured along a same direction (e.g., the direction X). For example, a ratio of the width W2 to the width W3 may be in the range from 1 to 8. In some embodiments, the profile along the Z direction of the openings 612 may be somewhat tapered, rather than vertical. As such, the redistribution via 621 may widen proceeding along the Z direction away from the through via 521. In such cases, the width W3 is measured at the junction of the redistribution via 621 with the through via 521, for example, at the level height along the Z direction of the bottom surface 610b of the dielectric layer 610. In some embodiments, similar dimensional relationships to the ones described above apply for the bare dies 200. For example, a ratio of the width W4 of the contact posts 240 to the width W5 of the through via 522 to which the contact post 240 is connected may be in a range from 0.5 to 4. In some embodiments, the width W5 of the through via 522 is greater than the width W6 of the redistribution via 623 to which the through via 522 is connected. For example, the ratio of the width W5 to the width W6 is in the range from 1 to 8. The width W4, W5 and W6 are all be measured along a same direction (e.g., the direction X).

In accordance with some embodiments of the disclosure, a semiconductor package includes semiconductor dies, an encapsulant, a high-modulus dielectric layer, and a redistribution structure. The encapsulant encapsulates the semiconductor dies and is made of a first material. The high-modulus dielectric layer extends on the encapsulant and the semiconductor dies. The high-modulus dielectric layer is made of a second material. The redistribution structure extends on the high-modulus dielectric layer. The redistribution structure includes conductive patterns embedded in at least a pair of dielectric layers. The dielectric layers of the pair are made of a third material. The elastic modulus of the first material is higher than the elastic modulus of the third material. The elastic modulus of the second material is higher than the elastic modulus of the third material.

In accordance with some embodiments of the disclosure, a semiconductor device includes a printed circuit board and a semiconductor package electrically connected to the printed circuit board. The semiconductor package includes: a first semiconductor die, a second semiconductor die, an encapsulant, a redistribution structure, connective terminal, and a buffer layer. The encapsulant laterally encapsulates the first semiconductor die and the second semiconductor die. The redistribution structure is disposed over a top surface of the encapsulant and is electrically connected to the first semiconductor die and the second semiconductor die. The connective terminals are disposed on an opposite side of the redistribution structure with respect to the first semiconductor die and the second semiconductor die. The connective terminals connect the redistribution structure to the printed circuit board. The buffer layer is disposed between the encapsulated first semiconductor die and second semiconductor die on one side and the redistribution structure on an opposite side. The buffer layer includes a high-modulus dielectric layer and through vias. The through vias extend through the high-modulus dielectric layer and electrically connect the first semiconductor die and the second semiconductor die to the redistribution structure. A ratio of an elastic modulus of the high-modulus dielectric layer to an elastic modulus of the encapsulant is in a range from 0.5 to 3.

In accordance with some embodiments of the disclosure, a manufacturing method of a semiconductor package includes at least the following steps. Semiconductor dies are encapsulated in an encapsulant. Each semiconductor die has contact posts exposed at a level height of a top surface of the encapsulant. Through vias are formed on the contact posts of the encapsulated semiconductor dies. The through vias are wrapped in a high-modulus dielectric layer. A redistribution structure is formed on the high-modulus dielectric layer. The redistribution structure is electrically connected to the semiconductor dies via the through vias. An elastic modulus of the high-modulus dielectric layer is about 0.5 to 3 times an elastic modulus of the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   semiconductor dies;
   an encapsulant, encapsulating the semiconductor dies, wherein the encapsulant is made of a first material;
   a high-modulus dielectric layer, extending on the encapsulant and the semiconductor dies, wherein the high-modulus dielectric layer is made of a second material; and
   a redistribution structure, extending on the high-modulus dielectric layer, wherein the redistribution structure includes redistribution conductive layers embedded in at least a pair of dielectric layers, and the pair of dielectric layers is made of a third material,
   wherein an elastic modulus of the first material is higher than an elastic modulus of the third material, and an elastic modulus of the second material is higher than an elastic modulus of the third material, and a ratio of the elastic modulus of the second material to the elastic modulus of the first material is in the range from 0.5 to 3.

2. The semiconductor package of claim 1, wherein
   at least one semiconductor die of the semiconductor dies comprises an active surface exposing conductive posts embedded in a protective layer,
   the high-modulus dielectric layer is disposed on the protective layer,
   the protective layer is made of a fourth material, and
   a ratio of the elastic modulus of the second material to an elastic modulus of the fourth material is at least 1.5.

3. The semiconductor package of claim 1, wherein the semiconductor dies are electrically connected to the redistribution structure by through vias extending through the high-modulus dielectric layer.

4. The semiconductor package of claim 1, wherein the first material is different from the second material.

5. The semiconductor package of claim 4, wherein the first mater al includes an organic resin with first inorganic fillers and the second material includes another organic resin with second inorganic fillers.

6. The semiconductor package of claim 4, wherein the second material includes a ceramic material.

7. The semiconductor package of claim 1, wherein the encapsulant includes a first portion of a first thickness and a second portion of a second thickness, the second thickness is smaller than the first thickness, and the second portion is disposed between one semiconductor die of the semiconductor dies and the high-modulus dielectric layer.

8. The semiconductor package of claim 1, wherein the first material includes an organic material, and the second material includes an inorganic material.

9. A semiconductor package, comprising:
   a first semiconductor die;
   a second semiconductor die;
   an encapsulant, laterally encapsulating the first semiconductor die and the second semiconductor die;
   a redistribution structure, disposed over a top surface of the encapsulant, electrically connected to the first semiconductor die and the second semiconductor die;
   connective terminals, disposed on an opposite side of the redistribution structure with respect to the first semiconductor die and the second semiconductor die; and
   a buffer layer, disposed between the encapsulated first semiconductor die and second semiconductor die on one side and the redistribution structure on an opposite side, the buffer layer comprising:
   a high-modulus dielectric layer; and
   through vias extending through the high-modulus dielectric layer and electrically connecting the first semiconductor die and the second semiconductor die to the redistribution structure,
   wherein a ratio of an elastic modulus of the high-modulus dielectric layer to an elastic modulus of the encapsulant is in a range from 0.5 to 3.

10. The semiconductor package of claim 9, wherein a portion of the encapsulant extends between the second semiconductor die and the buffer layer.

11. The semiconductor package of claim 9, wherein a thickness of the buffer layer along a direction normal to the top surface of the encapsulant is in a range from 10 micrometers to 200 micrometers.

12. The semiconductor package of claim 9, wherein
   the first semiconductor die comprises contact posts exposed at an active surface of the first semiconductor die, and
   the buffer layer extends on the active surface of the first semiconductor die.

13. The semiconductor package of claim 12, wherein the buffer layer further comprises seed layers interposed between the through vias and the contact posts of the first semiconductor die.

14. The semiconductor package of claim 12, wherein a width in a first direction of one contact post of the contact posts of the first semiconductor die is substantially equal to a width in the first direction of one through vias of the through vias,
   the one through via contacts the one contact post, and
   the first direction extends parallel to the active surface of the first semiconductor die.

15. The semiconductor package of claim 14, wherein the redistribution structure includes a routing trace and a redistribution via connecting the routing trace to the one through via, and the width in the first direction of the one through via is greater than a width in the first direction of the redistribution via.

16. A manufacturing method of a semiconductor package, comprising:
- encapsulating semiconductor dies in an encapsulant, each semiconductor die having contact posts exposed at a level height of a top surface of the encapsulant;
- forming through vias on the contact posts of the encapsulated semiconductor dies;
- wrapping the through vias in a high-modulus dielectric layer; and
- forming a redistribution structure having a dielectric layer on the high-modulus dielectric layer,
- wherein the redistribution structure is electrically connected to the semiconductor dies via the through vias,
- an elastic modulus of the dielectric layer is lower than an elastic modulus of the high-modulus dielectric layer, and
- an elastic modulus of the high-modulus dielectric layer is about 0.5 to 3 times an elastic modulus of the encapsulant.

17. The manufacturing method of claim 16, wherein forming the through vias comprises:
- disposing a seed material layer over the encapsulated semiconductor dies;
- providing an auxiliary mask on the seed material layer, wherein the auxiliary mask includes openings exposing portions of the seed material layer overlying the contact posts of the semiconductor dies; and
- disposing a conductive material in the openings of the auxiliary mask.

18. The manufacturing method of claim 16, wherein wrapping the through vias in a high-modulus dielectric layer comprises:
- laminating a high-modulus dielectric material layer on the encapsulated semiconductor dies, the high-modulus dielectric material layer covering the through vias; and
- grinding away portions of the high-modulus dielectric material layer until the through vias are exposed to form a high-modulus dielectric layer.

19. The manufacturing method of claim 16, wherein forming the redistribution structure comprises:
- forming the dielectric material layer on the high-modulus dielectric layer, wherein the dielectric material layer has an elastic modulus of in the range of 2 to 4 GPa;
- patterning the dielectric material layer to forma dielectric layer having openings exposing the through vias; and
- disposing a conductive material within the openings of the dielectric layer to form redistribution conductive layers electrically connected to the through vias.

20. The manufacturing method of claim 16, wherein encapsulating the semiconductor dies comprises:
- placing on a carrier a first semiconductor die and a second semiconductor die, the first semiconductor die and the second semiconductor die differing in thickness so that top surfaces of the contact posts of the first semiconductor die initially reach a higher level height over the carrier than top surfaces of the contact posts of the second semiconductor die;
- burying the first semiconductor die and the second semiconductor die in an encapsulating material; and
- removing portions of the encapsulant and portions of the contact posts of the first semiconductor die until the contact posts of the second semiconductor die are exposed.

* * * * *